(12) United States Patent
Morrow et al.

(10) Patent No.: US 7,205,920 B2
(45) Date of Patent: Apr. 17, 2007

(54) CONTINUOUS-TIME-SIGMA-DELTA DAC USING CHOPPER STABALIZATION

(75) Inventors: Paul John Morrow, Limerick (IE); Maria del Mar Chamarro Marti, Valencia (ES); Colin G. Lyden, Cork (IE); Mike Dominic Keane, Limerick (IE); Robert W. Adams, Acton, MA (US); Richard Thomas O'Brien, Limerick (IE); Paschal Thomas Minogue, Limerick (IE); Hans Johan Olaf Mansson, Limerick (IE); Atsushi Matamura, Tokyo (JP); Andrew Abo, Can Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/228,114

(22) Filed: Sep. 16, 2005

(65) Prior Publication Data
US 2006/0139193 A1    Jun. 29, 2006

Related U.S. Application Data

(60) Provisional application No. 60/650,641, filed on Feb. 4, 2005, provisional application No. 60/610,914, filed on Sep. 17, 2004.

(51) Int. Cl.
*H03M 1/66* (2006.01)
(52) U.S. Cl. ...................... 341/144; 341/145
(58) Field of Classification Search ............... 341/144, 341/143, 145
See application file for complete search history.

(56) References Cited

U.S. PATENT DOCUMENTS

| | | | | |
|---|---|---|---|---|
| 5,625,357 A | * | 4/1997 | Cabler | 341/143 |
| 6,917,321 B1 | * | 7/2005 | Haurie et al. | 341/144 |
| 6,924,759 B2 | * | 8/2005 | Wynne et al. | 341/144 |

* cited by examiner

*Primary Examiner*—Rexford Barnie
*Assistant Examiner*—Joseph Lauture
(74) *Attorney, Agent, or Firm*—Wolf, Greenfield & Sacks, P.C.

(57) ABSTRACT

A sigma-delta digital-to-analog converter comprises a current digital-to-analog converter (IDAC) stage which generates a current depending on an input digital signal. An output current-to-voltage converter converts the generated signal to a voltage on a continuous-time basis. The amplifier used in the output current-to-voltage converter is chopper-stabilized. The converter can be single bit or multi-bit. The IDAC stage can be implemented with a pair of branches, a first branch comprising a first biasing current source and a second branch comprising a second biasing current source. The biasing current sources can be chopper-stabilized by connecting the bias current sources to the output current-to-voltage converter by a set of switches. The switches connect the biasing current sources to the output current-to-voltage converter in a first configuration and a second, reversed, configuration. This modulates flicker noise contributed by the bias current sources to the chopping frequency. from where it can be removed by filtering downstream of the current-to-voltage converter.

22 Claims, 10 Drawing Sheets

CONTINUOUS-TIME-SIGMA-DELTA DAC USING CHOPPER STABALIZATION

PRIORITY CLAIM CROSS REFERENCE TO RELATED APPLICATIONS

This application claims the benefit under 35 USC 119(e) of U.S. patent application Ser. No. 60/610,914, filed Sep. 17, 2004 and U.S. patent application Ser. No. 60/650,641, filed Feb. 4, 2005, both now expired.

FIELD OF THE INVENTION

This invention relates to continuous-time sigma-delta digital-to-analog converters.

BACKGROUND TO THE INVENTION

FIG. 1 shows the architecture of a typical sigma-delta DAC. For the sake of explanation, this example is labelled with data that would arise in an audio application although the architecture can be used in a wide range of applications. A digital data signal (e.g. 16 bit audio data at a rate of 48 kHz) is upsampled by an interpolator 2 at some multiple of the original data rate. In this example the upsampling ratio is (6.144 MHz/48 kHz)=128x. The resulting oversampled digital signal is applied to a multi-bit sigma-delta modulator 3. The multi-bit digital data output by the modulator 3 is applied to a multi-bit current DAC 4 to generate a multi-level analog current signal. This is converted to an analog voltage signal by a current-to-voltage converter 5. Finally, the stepped voltage signal is applied to a low pass filter 6 to provide a smoothed analog output signal.

FIGS. 2 and 3 show generalized topologies for the IDAC and I-V converter stages 4, 5 of the DAC of FIG. 1. For a multi-bit IDAC the IDAC comprises a set of unit current digital-to-analog converters (IDAC) 50, i.e. a set of IDACs which each have the same value current source. For clarity, only one such unit IDAC is shown in detail in FIG. 2. Two biasing current sources 31, 32 each supply a bias current to balance the current from the IDAC 55 in midscale condition. The unit IDACs 50 can each have their current selectively steered via switches 53, 54 to draw current out of node 'Outb' 41 or node 'Out' 42 in the circuit. The IDAC receives a multi-bit digital word which is used to vary the current that is produced but the IDAC 55. The switches 53, 54 can be switched in a symmetrical manner or, if rise and fall times are mismatched, a dual return-to-zero switching scheme can be used. FIG. 3 shows an arrangement for dual return-to-zero operation, with two biasing current sources 51, 52, a set of switches 53, 54, 56, 57 which are driven by a dual return-to-zero driver. The paper "A 113 dB SNR Oversampling DAC with Segmented Noise-Shaped Scrambling", Adams. R et al presented at the 45$^{th}$ IEEE Solid-State Circuits Conference (ISSCC) 5–7 Feb. 1998 and published in the accompanying Digest of Technical Papers at p. 62–63, 413 describes a multi-bit CT sigma-delta DAC with a scrambler placed between the output of a sigma-delta modulator and the input to a current DAC.

The technology trend towards very deep sub-micron processes dictates lower power supply voltages. Continuous-time DACs are well suited to these processes. However, one limitation in achieving very high performance for continuous-time DACs in deep sub-micron technology is flicker noise. For the specialized case of using the DAC of FIG. 2 or 3 in a small sub-micron technology, the gate area of the MOS devices 51 used in the unit current sources within the IDAC 55 as well as the DC biasing current sources 31, 32 would require a excessive area in order to achieve low flicker noise. This is because flicker noise is inversely proportional to the area of a device. The input and output MOS devices of the amplifiers would also require a large gate area for achieving high performance. An alternative solution to reduce the area of the main flicker noise contributors would be desirable.

Accordingly, the present invention seeks to provide an improved sigma-delta DAC.

SUMMARY OF THE INVENTION

A sigma-delta digital-to-analog converter comprises a current digital-to-analog converter (IDAC) stage which generates a current depending on the value of an input digital word. An output current-to-voltage converter, which includes an amplifier, converts the generated current to a voltage on a continuous-time basis. The amplifier of the current-to-voltage converter is chopper-stabilized. This has the advantages of allowing the gate area of the devices used within the amplifier of the current-to-voltage converter to be reduced and improving the performance of the IDAC and current-to-voltage converter. Reducing the gate area of the devices used within the amplifier of the current-to-voltage converter allows the converter to be manufactured with a reduced die area.

The converter can be a single bit converter or, more preferably for clock jitter immunity, is a multi-bit converter which receives a multi-bit digital word and generates a multi-level output current.

The IDAC stage can be implemented with a pair of branches, a first branch comprising a first biasing current source and a second branch comprising a second biasing current source. The biasing current sources supply a bias current which balances the current drawn by the IDAC in a mid-scale condition. Preferably, the biasing current sources are chopper-stabilized as they also contribute flicker noise. This can be realized by connecting the biasing current sources to the output current-to-voltage converter by a set of chopping switches. The switches connect the biasing current sources to the output current-to-voltage converter in a first configuration and a second, reversed, configuration. This has an effect, in use, of modulating flicker noise contributed by the bias current sources to the chopping frequency, which is usually at the digital data rate or a binary division thereof, from where it can be removed by filtering positioned downstream of the current-to-voltage converter.

It is also possible to operate the IDAC stage in a self-biasing state in which the biasing current sources are not required. The IDAC is selectively connectable to the output current-to-voltage converter via a first path and a second path, the first path transmitting current from the IDAC to the current-to-voltage converter with a first polarity, and the second path transmitting current from the IDAC to the output current-to-voltage converter with an inverted polarity. This has the effect of balancing the currents contributed by the current source of the IDAC (or each unit value IDAC). This has an advantage of further reducing flicker noise by removing the flicker noise that would have been contributed by the bias current sources.

BRIEF DESCRIPTION OF THE DRAWINGS

Embodiments of the invention will be described with reference to the accompanying drawings in which.

DESCRIPTION OF PREFERRED EMBODIMENTS

Figure 1:
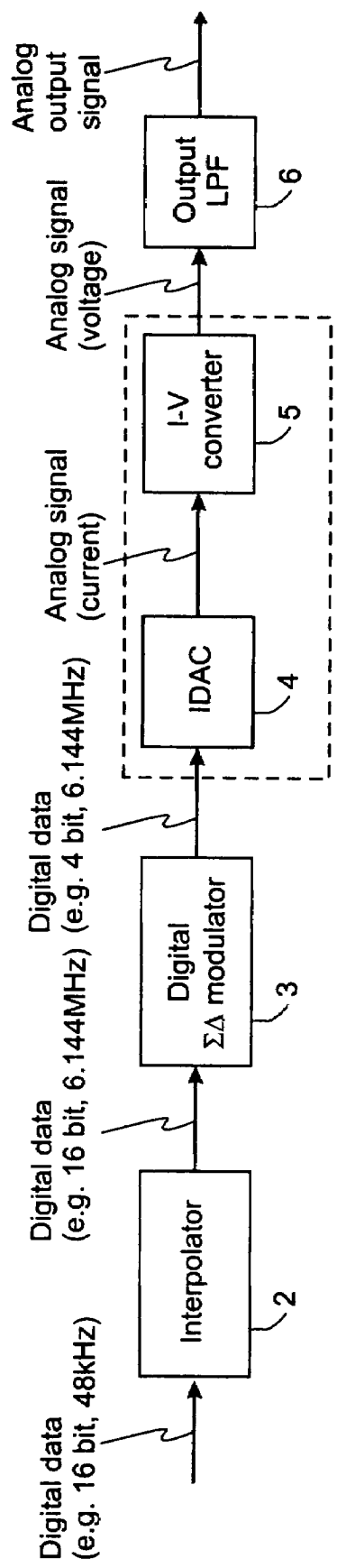
FIG. 1 shows an architecture of a sigma-delta DAC.
Figure 2:
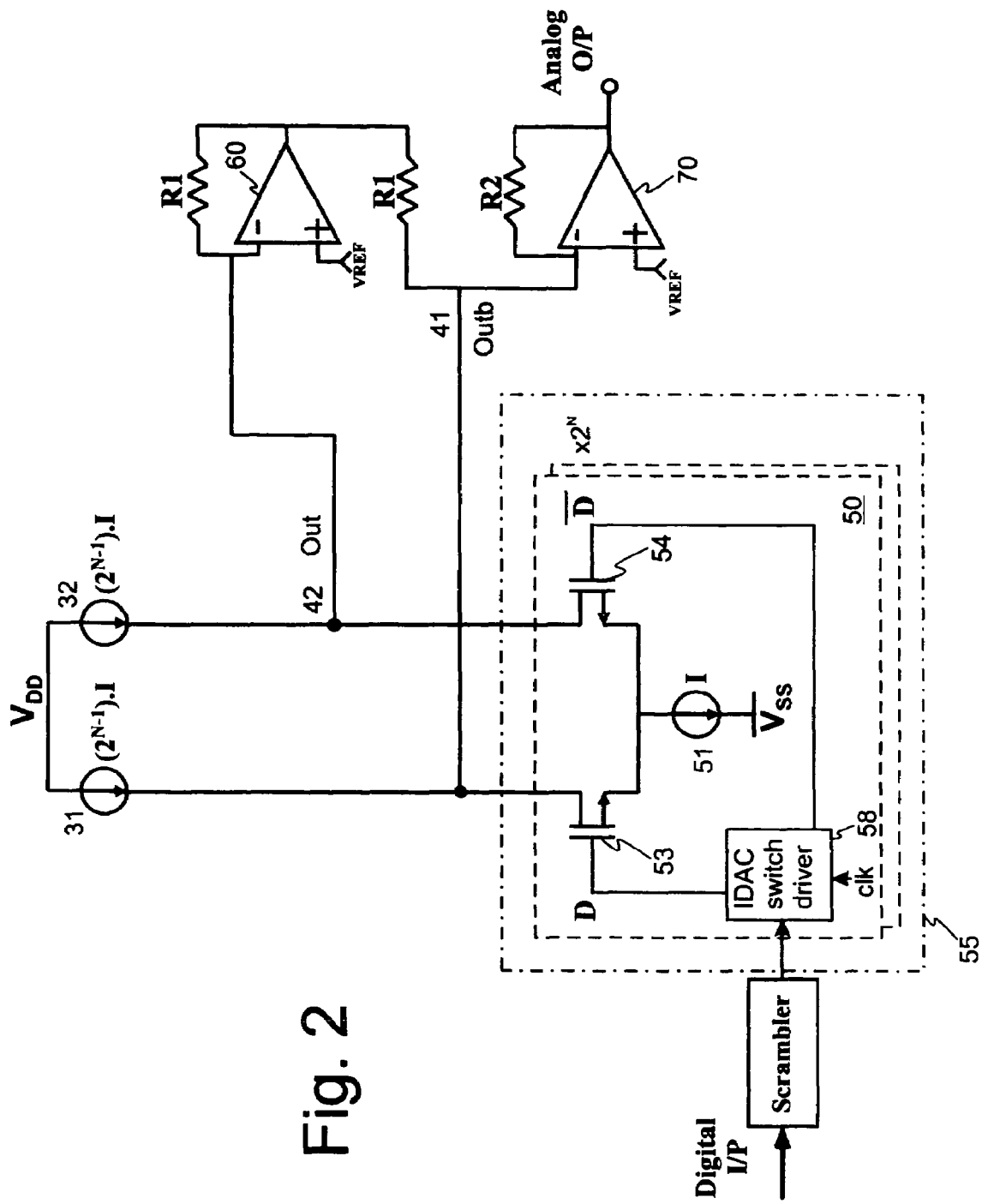
FIG. 2 shows a continuous-time single-ended output multi-bit current DAC for use in the architecture of FIG. 1.
Figure 3:
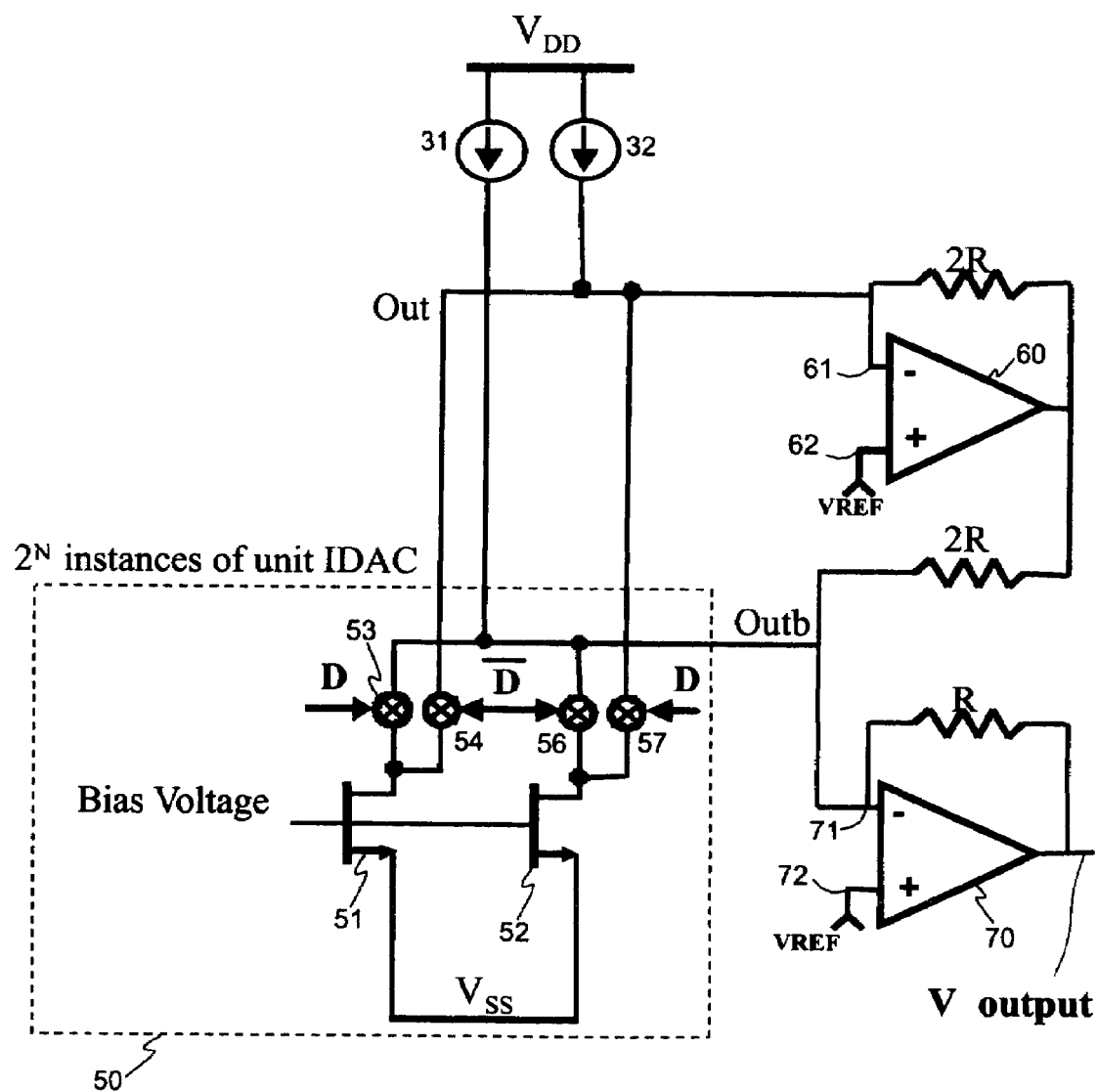
FIG. 3 shows another continuous-time single-ended output multi-bit current DAC for use in the architecture of FIG. 1.

The present invention will be described with respect to particular embodiments and with reference to certain drawings but the invention is not limited thereto but only by the claims. The drawings described are only schematic and are non-limiting.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. Furthermore, the terms first, second, third and the like in the description and in the claims, are used for distinguishing between similar elements and not necessarily for describing a sequential or chronological order.

Figure 4:
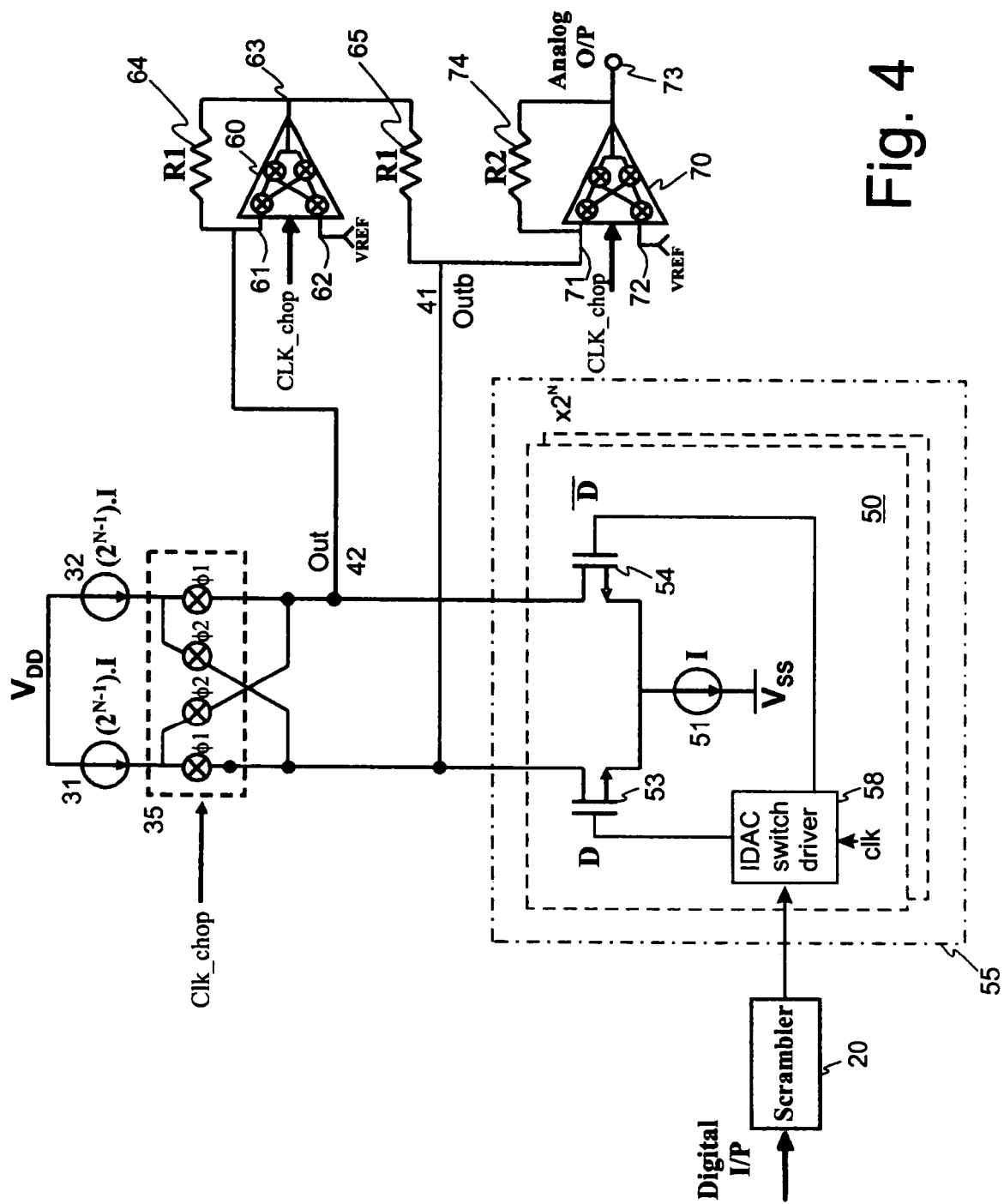
FIG. 4 shows a modified continuous-time single-ended output multi-bit current DAC with chopper-stabilization.

FIG. 4 shows an IDAC and I–V stage in accordance with a first embodiment of the invention. As will be described in more detail below, the IDAC 55 comprises a set of unit current digital-to-analog converters (IDAC) 50, i.e. a set of IDACs which each have the same value current source. For clarity, only one such unit IDAC 50 is shown in FIG. 4. For a DAC having $2^N$ possible output states, the IDAC 55 comprises a set of $2^N$ unit IDACs and there are $2^N$ digital data lines, one for each unit IDAC. The digital data lines are thermometer coded so that in the example of a 4 bit IDAC there are $2^4=16$ digital data lines, one line for each unit IDAC 55, which can take a value in the range 0–16. The digital data is operated on by a scrambler 20. The mismatch between the unit element current sources in the IDAC 55 is noise-shaped by the scrambler 20. For a given value of signal, the scrambler will vary the selection of unit IDACs to achieve that level of signal. Taking a 4 bit DAC example that comprises 16 thermometer coded digital data lines, and a required data value of 8, this requires eight of the unit IDACs to be steered in one direction via switch 53 while the other eight unit IDACs are steered in the alternative direction via switch 54. Rather than selecting the same set of eight IDACs on each occasion, the scrambler selects a different combination of IDACs on a pseudo-random basis to achieve the desired signal current. In the simplest case, this would select the set of IDACs '0000000011111111' on a first cycle and the set of IDACs '1111111100000000' on a second cycle. The use of the scrambler to select different combinations of IDACs in the continuous time stage has been found to have a chopping effect on flicker noise. For low level input signals, the output codes from the scrambler provide a spectrum that inherently modulates the current source flicker noise to a high frequency that is later removed. The digital data from the scrambler 20 is applied to an IDAC switch driver 58. In this embodiment the switch driver 58 drives the switches 53 and 54 in a symmetrically fashion, i.e. the D and D bar outputs are symmetrical with one another, with the D output rising as the D bar output falls.

The control signal indicates the required level of current that must be generated. The DAC comprises two biasing current sources 31, 32 which each supply a bias current to balance the current drawn from the IDAC 55 in midscale operation. A first current source 31 is connected between a supply rail $V_{DD}$ and a summing node 41 via a switch 35. A second current source 32 is connected between the supply rail $V_{DD}$ and a node 42 via a switch 35. As explained above, a set of unit IDACs connect to nodes 41, 42. A single such unit IDAC 50 is shown in detail in FIG. 4. The IDAC receives a multi-bit digital signal which is used to select the current path for each of the unit value IDACs 50. Each unit IDAC 50 comprises a current source 51. A first end of the current source 51, 52 is connected to ground shown as Vss in the figure. Current source 51 connects to node 41 via a switch 53 and to node 42 via a switch 54. Switches 53, 54 are controlled in a differential manner, i.e. switch 54 is fed the inverse of the control signal applied to switch 53.

An inverting input 61 of an op-amp 60 connects to node 42. The output 63 of the op-amp is connected to the inverting input via a path which includes a resistor 64. Op-amp 60 in combination with resistor 64 acts as a current-to-voltage converter. The output 63 of op-amp 60 is connected to node 41 via a resistor 65.

A set of chopping switches 35 alternately connect the biasing current sources 31, 32 to the nodes 41, 42 in a first configuration and a second configuration. In a first configuration, biasing current source 31 connects to node 41 and biasing current source 32 connects to node 42 (as previously described). In this configuration the switches driven by signal φ1 are closed and switches driven by O₂ are open. In a second configuration, the current sources are swapped around, with biasing current source 31 connecting to node 42 and biasing current source 32 connecting to node 41. In this configuration the switches driven by φ2 are closed and the switches driven by φ1 are open. The chopping switches receive a clock signal Clk_chop which controls the switching of the switches 35. Preferably, the chopping frequency is the same as the data rate to the IDAC or is a binary division of the data rate. The frequency which with the switches 35 are switched on and off determines the frequency to where the flicker noise of current sources 31 and 32 is modulated to.

Amplifier 60 in combination with resistor 64 forms a first current-to-voltage converter and amplifier 70 in combination with resistor 74 forms a second current-to-voltage converter. Both amplifiers 60, 70 are chopper-stabilized and each receives a signal clk_chop which controls the frequency of chopping. Good results have been obtained by chopping the amplifiers 60, 70 at half the frequency of that used to chop the bias current source 31. More generally, the chopping frequency used within the amplifiers for this invention can be at the same rate as the digital data rate to the IDAC or at a binary division of the digital rate (e.g. a division of 2, 4, 8).

The operation of the circuit will now be described. The sources of flicker noise in the arrangement shown in FIG. 4 are the current source 51 present within each IDAC 50, the bias current sources 31, 32 and the flicker noise present within the amplifiers 60 and 70. Chopping the bias current sources 31, 32 by connecting them alternately to nodes 41, 42 in one direction and then the other has the effect of modulating or shifting the flicker noise generated by the bias current sources to the frequency at which they are swapped back and forth.

Noise from the current source 51 within each IDAC 50 is chopped by the pseudo-random selection of IDACs by scrambler 20. The switching sequence for low level signals of the scrambler 20 employed in the signal path of the multi-bit DAC allows chopping to be accomplished without the need to explicitly employ chopping switches for the IDAC current sources 51. Explicit chopping switches 35 and a clock of sufficiently high frequency are required to chop the flicker noise of the DC biasing current sources 31, 32.

The flicker noise in a MOSFET transistor is modelled as a voltage source in series with the gate of value:

$$V_g^2(f) = \frac{K}{WLC_{OX}f}$$

where the constant K is dependent on device characteristics (which can vary for different devices in the same process). The variables W, L, and Cox represent the device width, length and capacitance per unit area, respectively. Flicker noise is inversely proportional to the device area (W*L). Chopper stabilization modulates the flicker noise to higher frequencies. Low-pass filtering downstream of the IDAC and I–V stages removes the frequency-shifted flicker noise.

The approach shown in FIG. 4 retains the advantages of a low area IDAC implementation while also reducing the flicker noise associated with the output stage of a single-ended sigma-delta continuous-time DAC. In the arrangement of FIG. 4 the current flowing in node Out is converted to a voltage by the DAC current-to-voltage converter 60, 64 which voltage is converted back to a current with inverted polarity by the resistor 65 at the output of the current-to-voltage amplifier. This current is then summed at the summing junction 41 with the current flowing through node Outb. Regardless of the direction of currents flowing in nodes Out and Outb, they are always equal in magnitude and opposite in sign to each other. The fact that the two different current paths to the summing junction are opposite in sign with respect to each other allows the flicker noise of the current source to be modulated to a higher frequency outside the band of interest and, hence, undesirable, that can be later removed by filtering. This structure also allows even order harmonic cancellation from the distortion produced by the switching of the current sources, as well as chopping of the DC biasing mid-scale current sources 31, 32. It can be seen that when the bias current source 31 is connected to summing node 41 in the first configuration via the left-hand switch φ1 bias current is injected into summing node 41 with a first polarity. When the bias current source 31 is connected to summing node 41 in the second configuration via switch φ2 bias current is injected into summing node 41 via node 42 and I–V converter 60, 64 with a second, opposite, polarity. Flicker noise generated by the current source, which gives rise to variations in the value of the current, appears at summing node 41 with the same relationship. Switching between the two configurations at a suitably high rate has the effect of modulating the flicker noise to a higher frequency. The same is true for current source 32. Flicker noise contributed by IDAC current source 51 is reduced in the same manner. It can be seen that when the IDAC current source 51 is connected to summing node 41 via switch 53 flicker noise appears at summing node 41 with a first polarity. When the IDAC current source 51 is connected to summing node 41 via switch 54, node 42 and I–V converter 60, 64 flicker noise appears at summing node 41 with a second, opposite, polarity. Switching between the two configurations at a suitably high rate modulates the flicker noise to this frequency.

Figure 5:
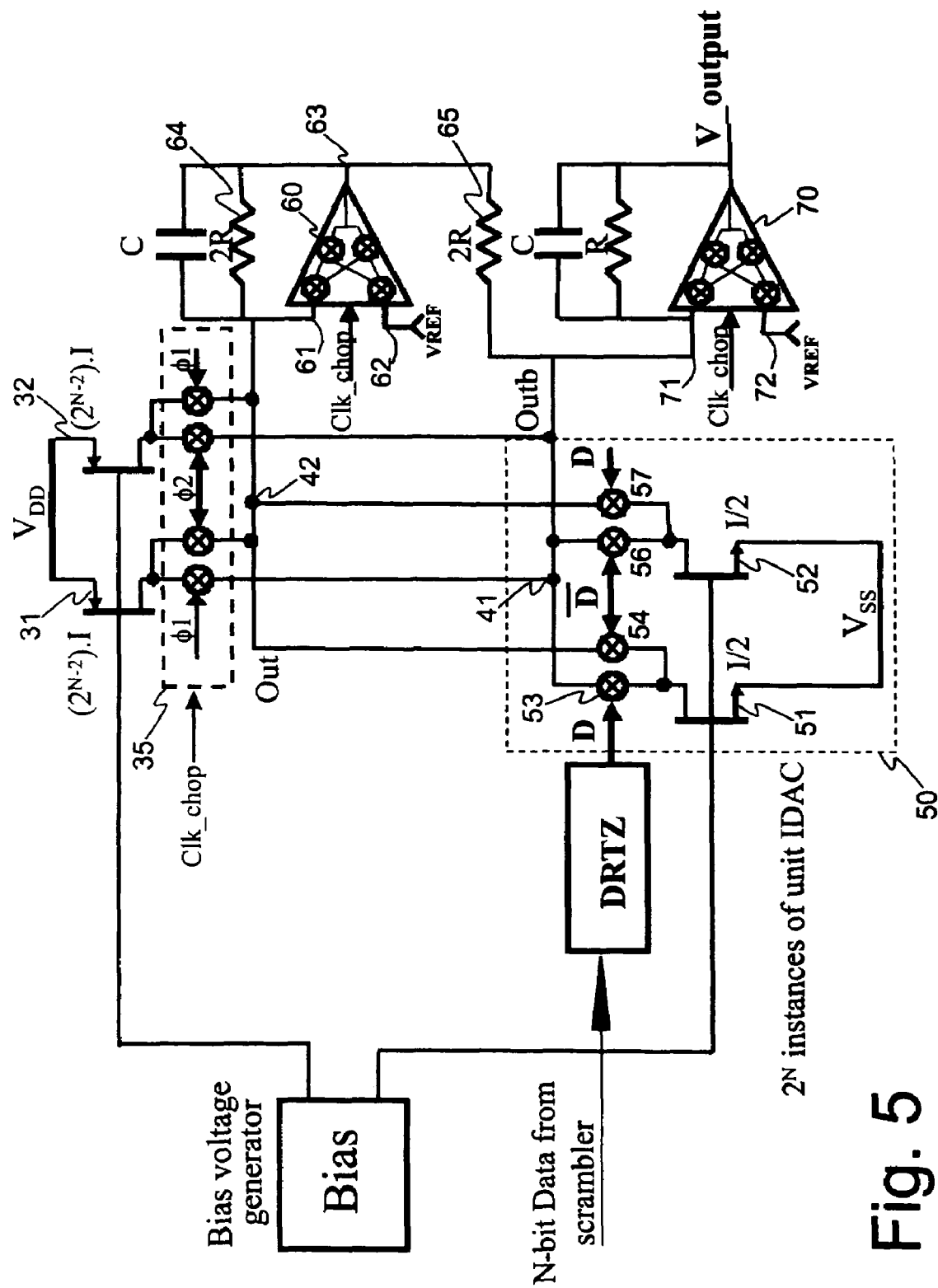
FIG. 5 shows another modified continuous-time single-ended output multi-bit current DAC with chopper-stabilization.

FIG. 5 shows an embodiment of an IDAC and I–V stage which is similar to that just described. This embodiment uses a dual return-to-zero switching scheme to offset the effects of different rise and fall times of switches 53, 54 in FIG. 4. A further current source 52 connects to node 41 via a switch 56 and to node 42 via a switch 57. Switches 56, 57 are controlled in a differential manner by a DRTZ (Dual Return to zero) switch driver. In other respects this embodiment works as previously described.

Figure 6:
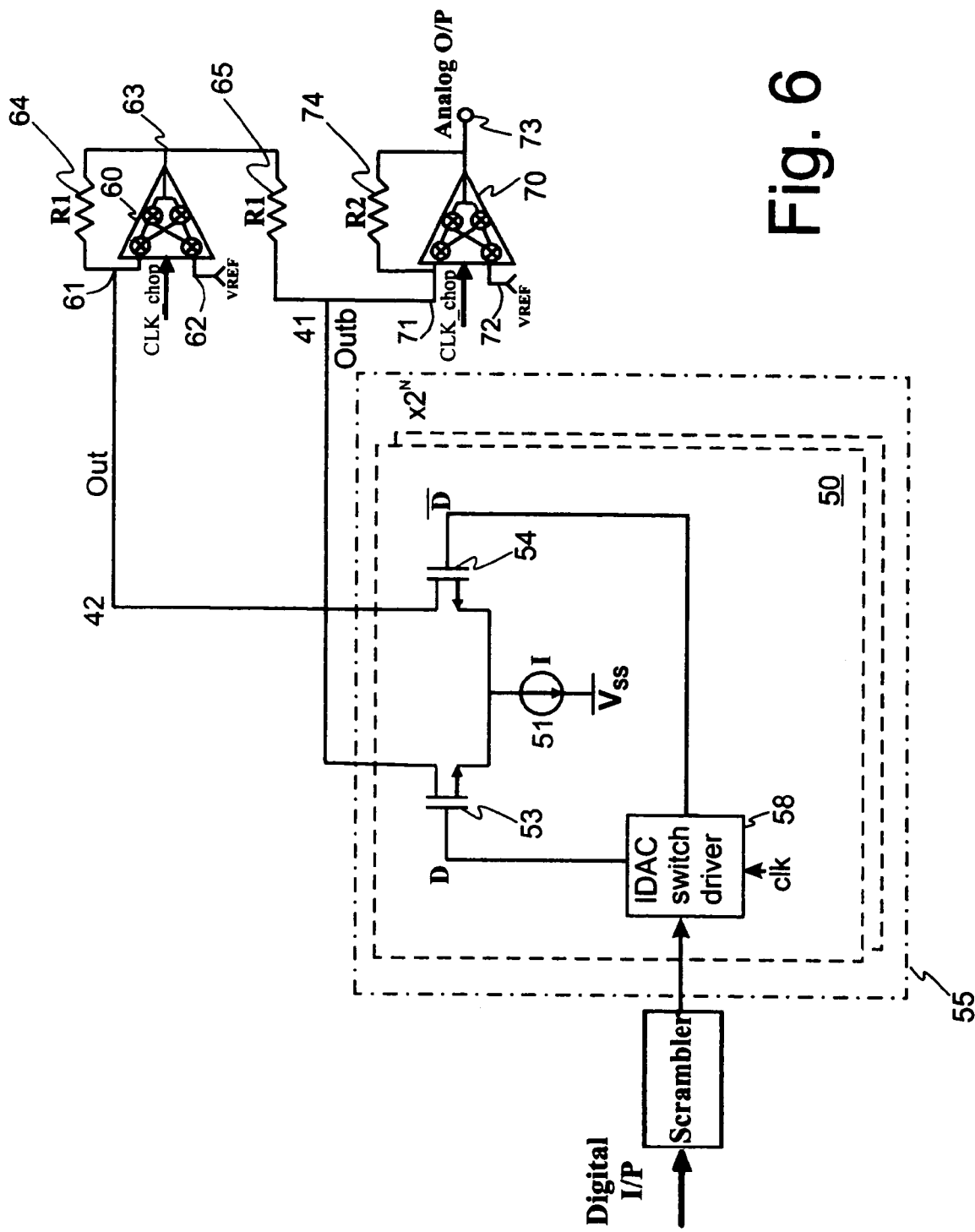
FIG. 6 shows a variant of the DAC of FIG. 4 with bias current sources removed.
Figure 7:
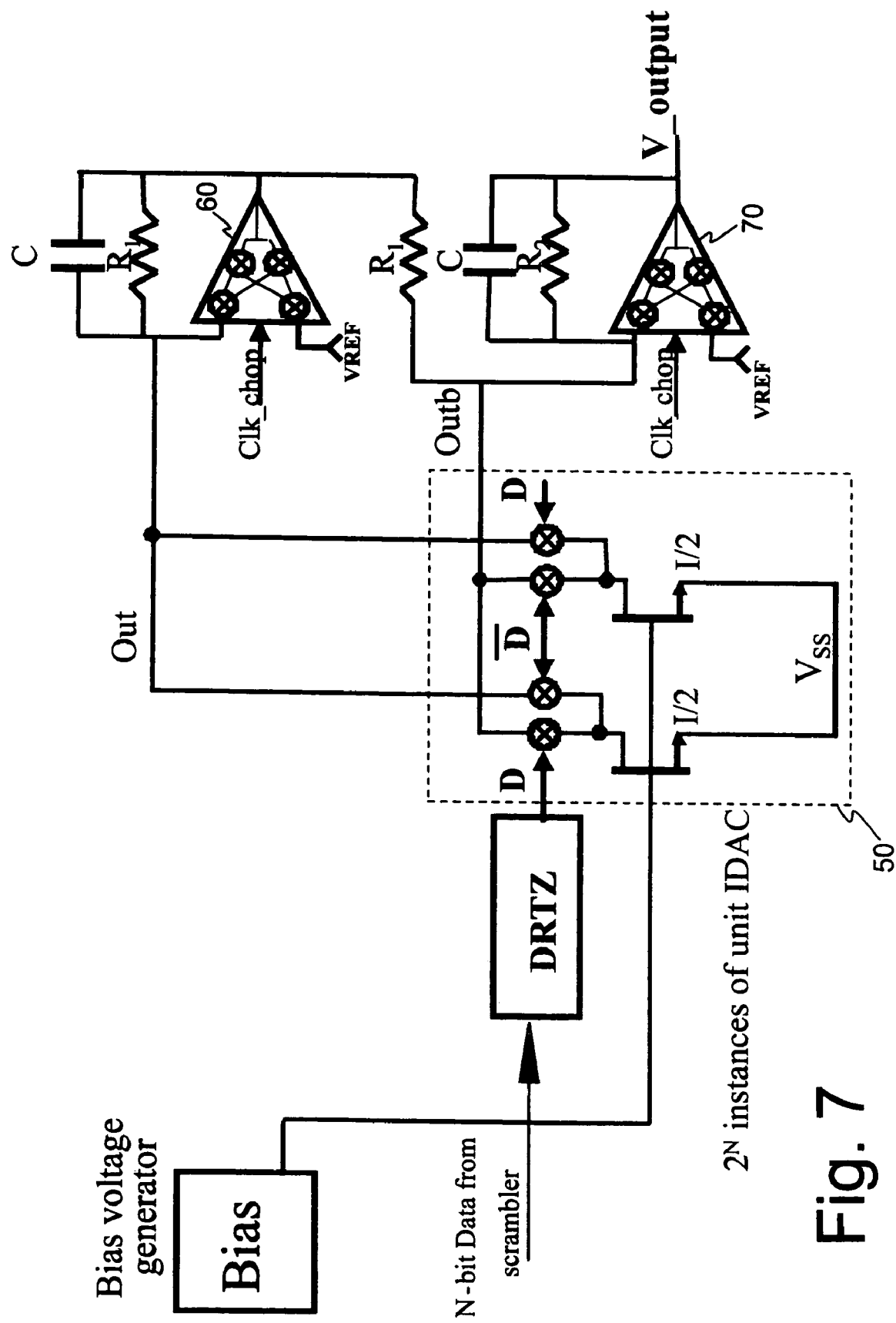
FIG. 7 shows a variant of the DAC of FIG. 5 with bias current sources removed.

FIGS. 6 and 7 show another embodiment of the invention in which the DC biasing current sources 31, 32 of FIGS. 4 and 5 are removed. The other components are the same as shown in FIGS. 4 and 5 and similar numbering is used. The inclusion of the DAC current-to-voltage converter 60 along with the resistor 65 ensures that the DAC produces a net zero current flowing into the summing junction 41 during mid-scale range. This allows removal of the DC biasing current sources 31, 32, thereby allowing for an improved noise performance by eliminating the noise that would normally be created by DC biasing current sources 31, 32. It should be remembered that node Outb 41 and node Out 42 each connect to a set of $2^N$ unit IDACs, only one of which is shown as IDAC 50 in FIG. 6.

To illustrate operation of the arrangement of FIGS. 6 and 7, assume a mid-range (no input signal) condition where a 16 bit thermometer coded digital signal from the scrambler comprises 8 bits set high and 8 bits set low. This digital signal is applied to the 16 IDACs 50. This will set eight of the IDACs 50 to have D enabled high. This causes current sources 51 of those IDACs to pull current out of the summing junction 41. The other eight IDACs have D set low, meaning that the current source 51 of those IDACs have their current flowing along the path 'Out'. The current that is being drawn from 'Out' is sourced by the op-amp 60. This creates a voltage greater than 'VREF' at the output 63 of the op-amp 60 since that current must flow through resistor 64. In creating that positive voltage above 'VREF' at the output 63 of the op-amp 60, this in turn injects a current that is equal in magnitude to the current flowing through node 'Out' into the summing junction 41 through resistor 65. So, the current that is drawn from the summing junction 41 is balanced by the current that is injected by the other path. As the paths are balanced the current sources 31, 32 shown in FIGS. 4 and 5 are no longer required.

Figure 8:
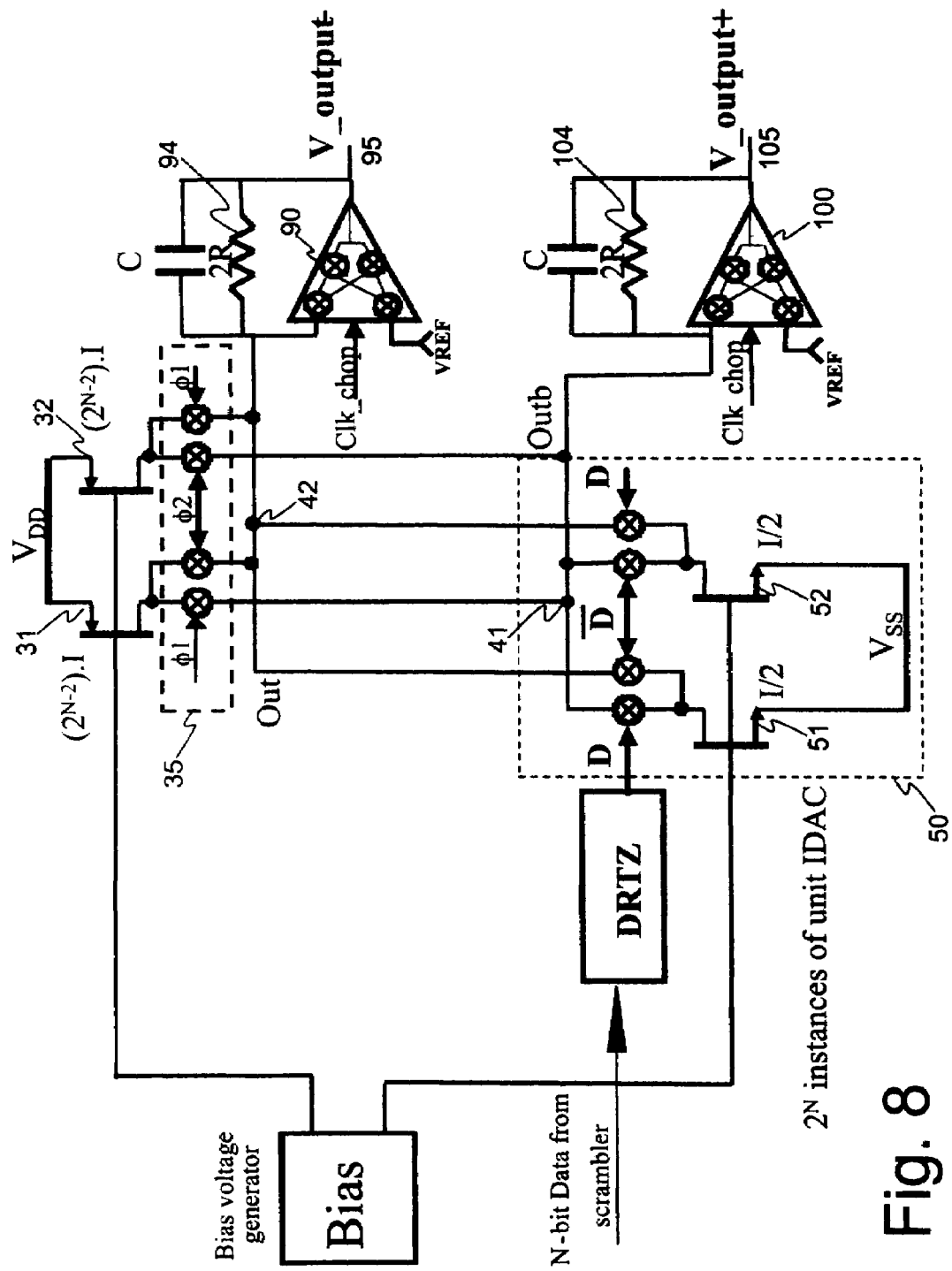
FIG. 8 shows a continuous-time sigma-delta DAC with chopper-stabilization and differential outputs.

FIG. 8 shows a further embodiment of the invention with differential outputs. As with the previous embodiments, a low area, high-performance DAC can be achieved by chopping the DC bias current sources and the output amplifiers. In this embodiment the biasing current sources 31, 32 are required. Node 42 is connected to the inverting input of an op-amp 90, operating as a current-to-voltage converter in combination with resistor 94, which contributes a first output 95 (V_output−). Node 41 is connected to the inverting input of an op-amp 100, operating as a current-to-voltage converter in combination with resistor 104, which contributes a second output 105 (V_output+). Chopping switches 35 are operated in the same manner as described above. In a first switching cycle current source 31 is connected to node 41 and current source 32 is connected to node 42 while in a second switching cycle current source 31 is connected to node 42 and current source 32 is connected to node 41. As before, amplifiers 90, 100 are each chopper-stabilized. Although FIG. 8 shows a differential scheme with Dual return-to-zero (DRTZ) switching, one pair of symmetrically-operated switches can be used as previously shown in FIG. 4.

Figure 9:
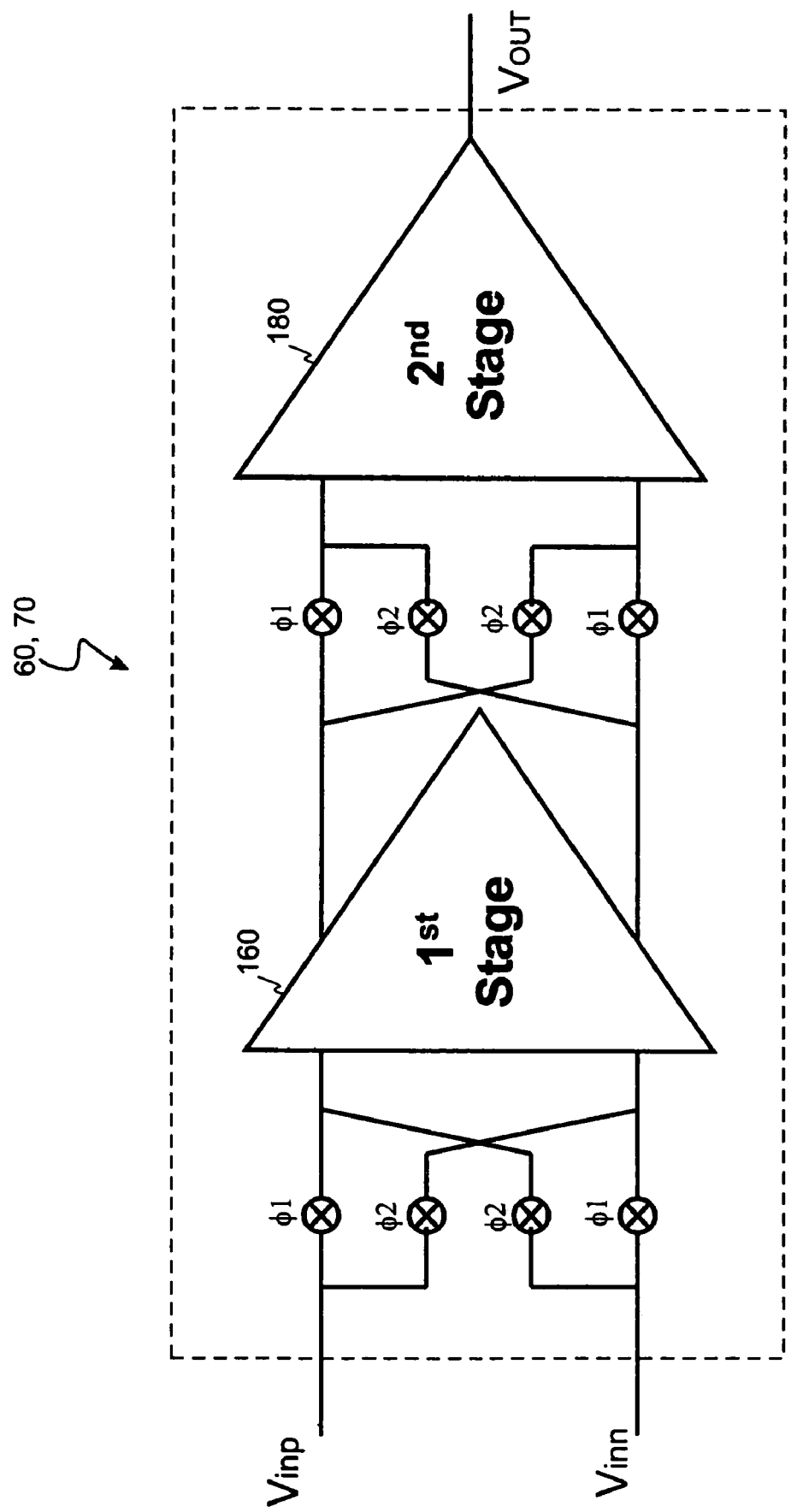
FIG. 9 schematically shows the two-stage amplifier used in the current DACs of FIGS. 4–7.
Figure 10:
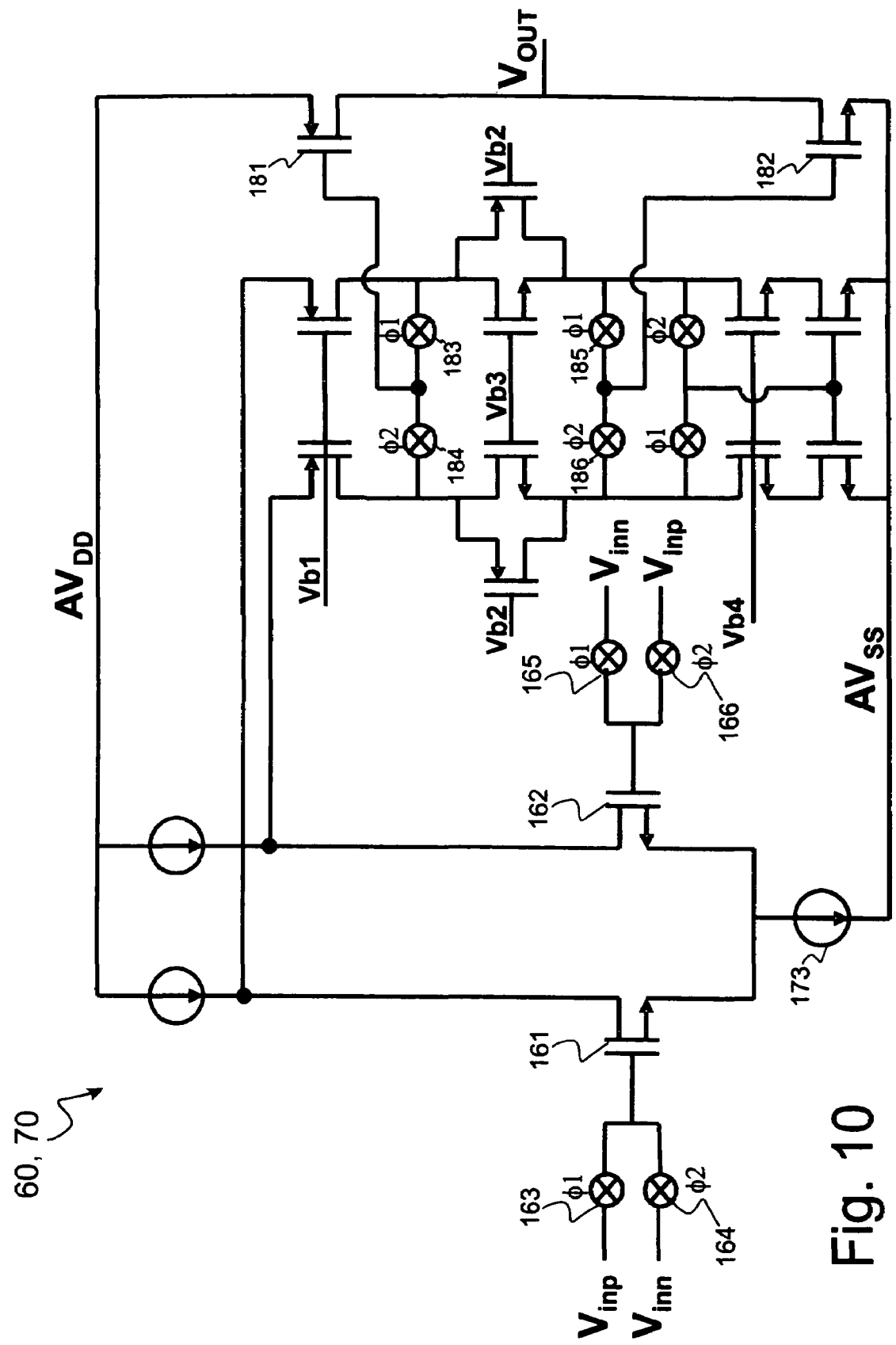
FIG. 10 shows the two-stage amplifier of FIG. 9 in more detail.

FIGS. 9 and 10 show one example embodiment of a chopper-stabilized amplifier which is suitable for use as the amplifier 60, 70 of the I–V converters in FIGS. 4–7. FIG. 9 shows the amplifier in schematic form and FIG. 10 shows the amplifier in more detail. These Figures show a single-ended output Class-AB amplifier although it will be appreciated that other designs could equally be used. The amplifier has two amplifier gain stages 160, 180. The first gain stage 160 receives a pair of differential inputs Vinp, Vinn and comprises devices 161, 162, as shown in more detail in FIG. 10. The second stage 180 comprises a pair of devices 181, 182 which are coupled together to form a single-ended output VOUT. The first stage 160 is biased by bias current sources 171, 172, 173. The first stage differential outputs 167, 168 are applied to the second stage amplifier 180. The first stage 160 differential inputs Vinp, Vinn are connected to devices 161, 162 via chopping switches 163-166. The first stage outputs 167, 168 are alternately connected to the devices 181, 182 of the second stage 180 via chopping switches 183-186. The topology within the amplifier varies during each of the two cycles of operation, with switches φ1 being closed and switches φ2 open during the first cycle, and switches φ1 being open and switches φ2 closed during the second cycle. This has the effect of swapping the inputs and outputs of the first stage 160 between cycles. It can be seen that during a first cycle Vinp is connected to the gate of device 161 via switch 163 and Vinn is connected to the gate of device 162 via switch 165. During a second cycle Vinn is connected to the gate of device 161 via switch 164 and Vinp is connected to the gate of device 162 via switch 166. The use of an amplifier having two stages, with chopper stabilization only of the first stage, has been found to provide a performance advantage in a continuous time DAC circuit.

The chopping switches 163–166, 183–186 within amplifiers 60, 70 and the chopping switches 35 can operate over a wide range of clock rates. In a circuit designed for television audio applications the circuit received a general circuit clock signal at a rate of 6.14 MHz and this clock signal was applied directly to the chopping switches. However, the circuit has also been operated at sub-multiples of this clock rate (e.g. 3.07 MHz) with similar results. In general, the chopping frequency used within the amplifiers for this invention can be at the same rate as the digital data rate to the IDAC or at a binary division of the digital rate (e.g. a division of 2, 4, 8).

Three architectures for low-noise low-area DAC output stages have been presented. These schemes allow supply noise to be differentially cancelled in the DAC structure; even order harmonic cancellation associated with the IDAC because of the differential structure; chopping of the DAC current source flicker noise; chopping of the DC bias current source. The scheme shown in FIGS. 6 and 7 also allows the removal of the DC biasing current source.

The invention is not limited to the embodiments described herein, which may be modified or varied without departing from the scope of the invention.

The invention claimed is:

1. A method of operating a sigma-delta digital-to-analog converter comprising:
    applying a digital input signal to a current digital-to-analog converter (IDAC) stage, comprising unit IDACs, to generate a current of a level depending on an input digital signal;
    converting the current to an analog voltage on a continuous-time basis in a current-to-voltage converter;
    chopper-stabilizing an amplifier of the current-to-voltage converter;
    varying the selection of unit IDACs to achieve each level of generated current; and
    modulating IDAC current source flicker noise using a scrambler and said amplifier.

2. An analog signal resulting from a method of operating a sigma-delta digital-to-analog converter, the method comprising:
    applying a digital input signal to a current digital-to-analog converter (IDAC) stage, comprising unit IDACs, to generate a current of a level depending on an input digital signal;
    converting the current to an analog signal on a continuous-time basis in a current-to-voltage converter;
    chopper-stabilizing an amplifier of the current-to-voltage converter;
    varying the selection of unit IDACs to achieve each level of generated current; and
    modulating IDAC current source flicker noise using a scrambler and said amplifier.

3. A sigma-delta digital-to-analog converter comprising:
    a current digital-to-analog converter (IDAC) stage, said IDAC stage comprising a set of unit IDACs, which is operable to generate a current of a level depending on an input digital signal;
    an output current-to-voltage converter which is operable to convert the generated signal to a voltage on a continuous-time basis, the output current-to-voltage converter comprising an amplifier; and
    each unit IDAC is selectively connectable to the output current-to-voltage converter via one of a first path and a second path, the first path transmitting current from the IDAC to the current-to-voltage converter with a first polarity, and the second path transmitting current from the IDAC to the output current-to-voltage converter with an inverted polarity,
    wherein the output current-to-voltage converter amplifier is chopper-stabilized.

4. A sigma-delta digital-to-analog converter comprising:
    a current digital-to-analog converter (IDAC) stage which is operable to generate a current depending on an input digital signal;
    an output current-to-voltage converter which is operable to convert the generated signal to a voltage on a continuous-time basis, the output current-to-voltage converter comprising an amplifier; and
    the IDAC being selectively connectable to the output current-to-voltage converter via one of a first path and a second path, the first path transmitting current from the IDAC to the current-to-voltage converter with a first polarity, and the second path transmitting current from the IDAC to the output current-to-voltage converter with an inverted polarity, wherein the output current-to-voltage converter amplifier is chopper-stabilized.

5. A sigma-delta digital-to-analog converter comprising:
a current digital-to-analog converter (IDAC) stage, said IDAC stage comprising a set of unit IDACs, which is operable to generate a current of a level depending on an input digital signal; and,
an output current-to-voltage converter which is operable to convert the generated signal to a voltage on a continuous-time basis, the output current-to-voltage converter comprising a chopper stabilized amplifier; and
a scrambler which varies the selection of unit IDACs to achieve each level of generated current, wherein the scrambler modulates IDAC current source flicker noise.

6. A converter according to claim 5 which is operable to receive a modulator clock signal at a frequency $F_S$ and wherein the output current-to-voltage converter amplifier is chopper-stabilized at $F_S$ or a binary subdivision thereof.

7. A converter according to claim 5 wherein the IDAC stage is a multi-bit IDAC stage which is operable to generate a multi-level current depending on an input digital signal in the form of a multi-bit digital word.

8. A converter according to claim 5 wherein the current-to-voltage converter comprises an amplifier having two gain stages, wherein only the first gain stage is chopper-stabilized.

9. A converter according to claim 5 wherein the IDAC stage has a pair of branches, a first branch comprising a first biasing current source and a second branch comprising a second biasing current source, the biasing current sources being operable to supply a bias current which biases the converter in a mid-scale condition, the output current-to-voltage converter being operable to sum the bias current with the generated current.

10. A converter according to claim 9 wherein the biasing current sources are chopper-stabilized.

11. A converter according to claim 10 wherein the biasing current sources are connected to the output current-to-voltage converter by a set of chopping switches which are operable to alternately connect the biasing current sources to the output current-to-voltage converter in a first configuration and a second, reversed, configuration.

12. A digital-to-analog converter according to claim 11 wherein the IDAC stage has a first branch with a first differential output line and a second branch with a second differential output line, each output line having a respective current-to-voltage converter and a summing node at the input of the current-to-voltage converter, and wherein the biasing current sources are connected to the summing nodes by chopping switches, the chopping switches being operable to connect the biasing current sources in a first configuration where the first biasing current source connects to the first summing node and the second biasing current source connects to the second summing node and a second configuration where the first biasing current source connects to the second summing node and the second biasing current source connects to the first summing node.

13. A converter according to claim 10 which is operable to receive a modulator clock signal at a frequency $F_S$ and wherein the chopping switches operate at $F_S$ or a binary subdivision thereof.

14. A converter according to claim 5 wherein each unit IDAC is selectively connectable to the output current-to-voltage converter via one of a first path and a second path, the first path transmitting current from the IDAC to the current-to-voltage converter with a first polarity, and the second path transmitting current from the IDAC to the output current-to-voltage converter with an inverted polarity.

15. A converter according to claim 14 or claim 3 wherein the digital signal individually selects each unit IDAC, the second path of each unit IDAC receiving an inverted version of the digital signal applied to the first path of each unit IDAC.

16. A converter according to claim 14 or claim 3 wherein the first path pulls current from the summing node and the second path injects current into the summing node.

17. A converter according to claim 14 or claim 3 wherein the second path comprises a further current-to-voltage converter and a first resistor.

18. A converter according to claim 17 wherein the further current-to-voltage converter comprises an amplifier having an inverting input which connects to the unit IDAC and an output which connects to the inverting input via a second resistor.

19. A converter according to claim 17 wherein the further current-to-voltage converter comprises an amplifier which is chopper-stabilized.

20. A converter according to claim 5 wherein the IDAC is selectively connectable to the output current-to-voltage converter via a first path and a second path, the first path transmitting current from the IDAC to the current-to-voltage converter with a first polarity, and the second path transmitting current from the IDAC to the output current-to-voltage converter with an inverted polarity.

21. A converter according to claim 20 or claim 4 which is self-biasing in a mid-scale condition.

22. A converter according to claim 5 in the form of an integrated circuit.

* * * * *